(12) United States Patent
Feng et al.

(10) Patent No.: US 9,608,608 B2
(45) Date of Patent: Mar. 28, 2017

(54) POWER MODULE

(71) Applicant: Delta Electronics (Shanghai) CO., LTD, Shanghai (CN)

(72) Inventors: Weiyi Feng, Shanghai (CN); Lizhi Xu, Shanghai (CN); Weiqiang Zhang, Shanghai (CN); Hongyang Wu, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 72 days.

(21) Appl. No.: 14/681,712

(22) Filed: Apr. 8, 2015

(65) Prior Publication Data
US 2015/0349761 A1 Dec. 3, 2015

(30) Foreign Application Priority Data

May 28, 2014 (CN) .......................... 2014 1 0231336

(51) Int. Cl.
*H03L 5/00* (2006.01)
*H02H 9/00* (2006.01)
(Continued)

(52) U.S. Cl.
CPC ................ *H03K 5/08* (2013.01); *H02M 1/34* (2013.01); *H02M 7/003* (2013.01); *H02M 7/487* (2013.01)

(58) Field of Classification Search
CPC .............. H03K 17/05128; H03K 5/08; H03M 2001/482; H02M 1/34; H02M 7/003; H02M 7/467
(Continued)

(56) References Cited

U.S. PATENT DOCUMENTS 5,260,607 A * 11/1993 Kinbara .................. H02M 1/34
327/427
5,953,222 A * 9/1999 Mizutani ............... H02M 7/003
363/132
(Continued)

FOREIGN PATENT DOCUMENTS

EP 0379346 A2 7/1990
JP 3136412 A 11/1991
(Continued)

OTHER PUBLICATIONS

Extended European search report issued Apr 29, 2016 by the EP Office.
Office Action issued May 10, 2016 by the JP Office.

*Primary Examiner* — Dinh T Le
(74) *Attorney, Agent, or Firm* — Yunling Ren

(57) ABSTRACT

A power module includes: a base plane; at least one switch chip assembled on the base plane; and a voltage clamping circuit for clamping a voltage spike occurring on the at least one switch chip, comprising components of a charging loop, wherein the components of the charging loop at least comprise a capacitor, wherein a projection of a center point of at least one of the components of the charging loop on the base plane is located within at least one first circle, defined with a center of the first circle being a center point of the at least one switch chip, and with a radius of the first circle being a product of a maximum one of a length and a width of the at least one switch chip and a first coefficient, which is a multiple of 0.5.

38 Claims, 11 Drawing Sheets

(51) Int. Cl.
*H03K 5/08* (2006.01)
*H02M 1/34* (2007.01)
*H02M 7/00* (2006.01)
*H02M 7/487* (2007.01)

(58) Field of Classification Search
USPC ............ 363/131, 43, 56, 27, 57, 78, 53, 54; 327/530, 544, 309, 306, 374–378
See application file for complete search history.

(56) References Cited

U.S. PATENT DOCUMENTS 8,934,275 B2 * 1/2015 Temesi ............. H03K 17/08128
  363/131
9,099,930 B2 * 8/2015 Wagoner ............... H02M 7/483

FOREIGN PATENT DOCUMENTS

| JP | H0833346 A | 2/1996 |
| JP | 1028377 A | 1/1998 |
| JP | 2013110303 A | 6/2013 |

\* cited by examiner

POWER MODULE

CROSS REFERENCE TO RELATED APPLICATIONS

The present application claims priority under 35 U.S.C. §119 to Chinese Patent Applications No. 201410231336.9, filed on May 28, 2014, the entire contents of which are incorporated herein by reference.

TECHNICAL FIELD

The present disclosure generally relates to a power module, more particularly, to a power module with a voltage clamping circuit built therein.

BACKGROUND

At present, with increasingly higher requirements on power density of power devices such as converters or inverters, especially the increased requirements on power density of power modules, increasing switching frequencies of internal switches of the power modules is one effective means for reducing the sizes of the power modules. Since a power module may employ smaller magnetic components and capacitors when high frequency switches are used inside the power module, a higher power density may be obtained.

However, more switching loss will be caused by only increasing the switching frequency. FIG. 1 illustrates curves showing relationships between turn-on loss and turn-off loss and switching speeds of a switching component. In order to guarantee a smaller switching loss (including the turn-on loss and the turn-off loss) when a high frequency switch is used, the switching speed (di/dt and dv/dt) needs to be increased as shown in FIG. 1. Vce in FIG. 1 is the voltage across the two sides of the switching component, and Ic is the current flowing through the switching component. One means for increasing the switching speed is employing a relatively smaller gate driving resistor Rg. FIG. 2 illustrates curves showing relationships between the gate driving resistance and the turn-on loss and turn-off loss of the switching component. As shown in FIG. 2, taking an Insulated Gate Bipolar Transistor (IGBT) with a model number of FF400R06KE3 provided by Infineon Corporation as an example, when a gate driving resistor Rg with a smaller resistance is employed, the turn-on loss is dramatically decreased. However, if Rg is lowered, a voltage applied on the IGBT and a diode will be greatly increased. FIG. 3 illustrates curves showing relationships between the voltage applied on the IGBT and the diode and the gate driving resistance. It can be seen from FIG. 3 that, when a smaller gate driving resistance Rg is employed, there is a large voltage applied on the IGBT and the diode, especially under a large current. Thus, when a converter or an inverter is overloaded, switching components in the converter or the inverter will bear a large current when turned on or off, and if a gate driving resistor Rg with a smaller resistance is employed, a voltage spike may destroy power devices such as a converter or an inverter.

In a power module, in order to limit the voltage spike across the internal switches, various voltage clamping circuits are widely used at external lead terminals of switches in a power module. Usually, a voltage clamping circuit includes a charging loop and a discharging loop. The charging loop includes at least a clamping capacitor C and may further include a switching component connected in series with the clamping capacitor C, such as a diode D or an active switching MOSFET (Metal Oxide Semiconductor Field Effect Transistor), and/or with a resistor. FIG. 4 illustrates a schematic diagram of charging loops of several voltage clamping circuits. FIG. 4(a) is a charging loop in an RCD voltage clamping circuit, FIG. 4(b) is a charging loop in a RC voltage snubber circuit, and FIG. 4(c) is a charging loop in a C voltage snubber circuit.

The discharging loop may include a discharging resistor R connected in series with the clamping capacitor C, i.e., the charging loop and the discharging loop share the clamping capacitor C. Further, the discharging loop may include a switching component such as a MOSFET or a diode, connected in series with the discharging resistor R.

FIG. 5 illustrates an RCD voltage clamping circuit used for an internal switch $S_1$ when an internal circuit of a power module is a two-level and a three-level Neutral Point Clamped (NPC) type. In FIG. 5, the charging loop includes a capacitor C and a diode D connected in series with the capacitor C, and the discharging loop includes the capacitor C and a resistor R.

However, even with the voltage clamping circuit as shown in FIG. 5 connected to external lead terminals of internal switches in a power module, there is still a large actual instantaneous voltage applied on the switch $S_1$. Taking the three-level NPC converter as shown in FIG. 5(b) as an example, according to experiments, when the current on the switch $S_1$ being turned off is 150 A, although the instantaneous voltage of the switch $S_1$ detected from external lead terminals is 338V, the voltage between the collector and the emitter of the switch $S_1$ detected directly from the inside of the converter is 413V. Actually, internal switches bear a larger instantaneous voltage.

SUMMARY

In order to overcome the above problems, the present disclosure provides a power module.

The additional aspects and advantages of the present disclosure will be illustrated, in part, in the following description, and will become, in part, distinct from the following description, or may be achieved by putting the present disclosure into practice.

According to an aspect of the present disclosure, a power module is provided. The power module includes: a base plane; at least one switch chip assembled on the base plane; and a voltage clamping circuit for clamping a voltage spike occurring on the at least one switch chip, including components of a charging loop, wherein the components of the charging loop at least include a capacitor, wherein a projection of a center point of at least one of the components of the charging loop on the base plane is located within at least one first circle, defined with a center of the first circle being a center point of the at least one switch chip, and with a radius of the first circle being a product of a maximum one of a length and a width of the at least one switch chip and a first coefficient which is a multiple of 0.5.

According to another aspect of the present disclosure, another power module is provided. The power module includes: a base plane; at least one switch chip assembled on the base plane; and a voltage clamping circuit for clamping a voltage spike occurring on the at least one switch chip, including first components of a charging loop and a second component of the charging loop, wherein at least one of the first components of the charging loop and the second component of the charging loop is a capacitor, wherein a projection of a center point of at least one of the first components of the charging loop on the base plane is located within at least one first circle, defined with a center of the first circle being a center point of the at least one switch chip, and with a radius of the first circle being a product of a maximum one of a length and a width of the at least one switch chip and a first coefficient which is a multiple of 0.5, or wherein a projection of a center point of at least one of the first components of the charging loop on the base plane is located within a second circle, defined with a center of the second circle being a center point of the second component of the charging loop on the base plane, and with a radius of the second circle being a product of a maximum one of a length and a width of the second component of charging loop and the first coefficient.

BRIEF DESCRIPTION OF THE DRAWINGS

The above and other features and advantages of the present disclosure will become clear from detailed description of exemplary embodiments with reference to accompanying drawings.

DETAILED DESCRIPTION

Now, exemplary implementations will be described more comprehensively with reference to the accompanying drawings. However, the exemplary implementations may be carried out in various manners, and shall not be interpreted as being limited to the implementations set forth herein; instead, providing these implementations will make the present disclosure more comprehensive and complete and will fully convey the conception of the exemplary implementations to the ordinary skills in this art.

The features, structures or characteristics described herein may be combined in one or more embodiments in any suitable manner. In the following description, many specific details are provided to facilitate sufficient understanding of the embodiments of the present disclosure. However, the ordinary skills in this art will appreciate that the technical solutions in the present disclosure may be practiced without one or more of the specific details, or by employing other methods, components, materials and so on. In other circumstances, well-known structures, materials or operations are not shown or described in detail so as to avoid confusion of respective aspects of the present disclosure.

Currently, in an internal circuit of a power module, although a voltage clamping circuit is used, an actually detected instantaneous voltage across an internal switch is significantly higher than an instantaneous voltage detected between its external lead terminals. The research finding shows that this is because of additional parasitic inductances existing inside the power module.

Figure 1:
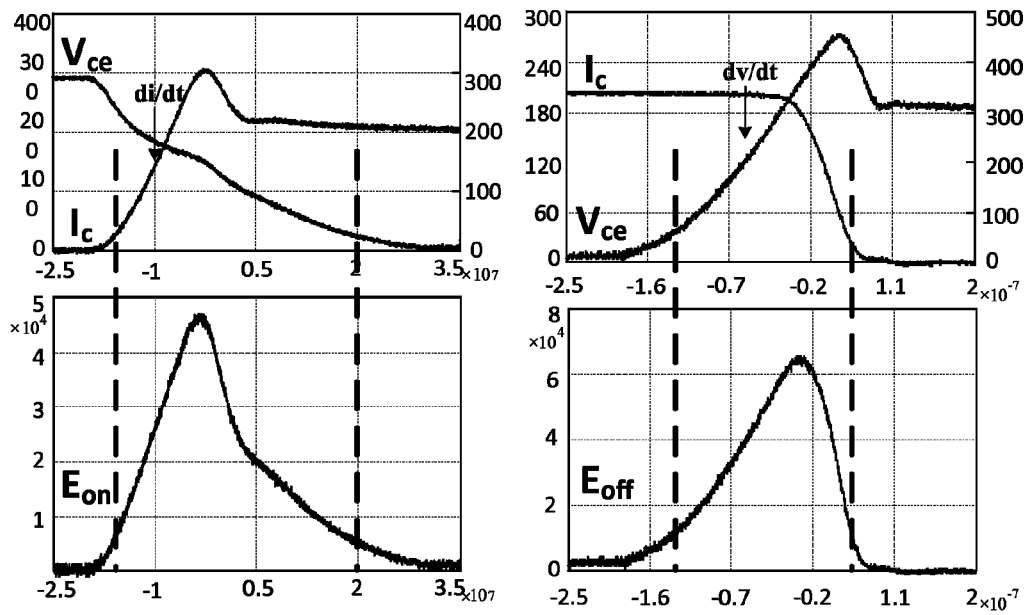
FIG. 1 illustrates curves showing relationships between turn-on loss and turn-off loss and switching speed of a switching component.
Figure 2:
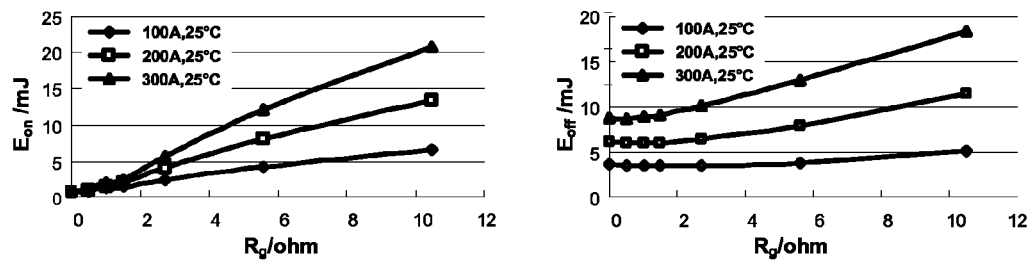
FIG. 2 illustrates curves showing relationships between gate driving resistance and turn-on loss and turn-off loss of a switching component.
Figure 3:
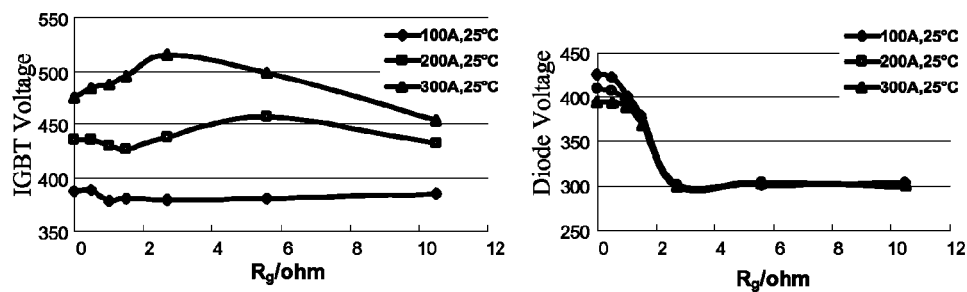
FIG. 3 illustrates curves showing relationships between a voltage applied on a IGBT and a diode and the gate driving resistance.
Figure 4:
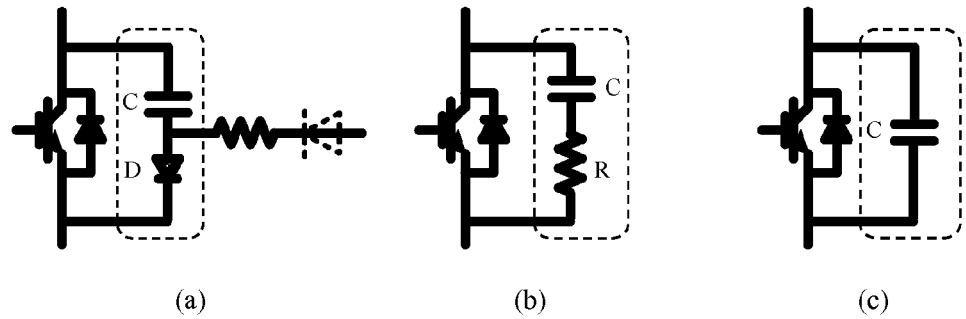
FIG. 4 illustrates a schematic diagram of charging loops of several voltage clamping circuits.
Figure 5:
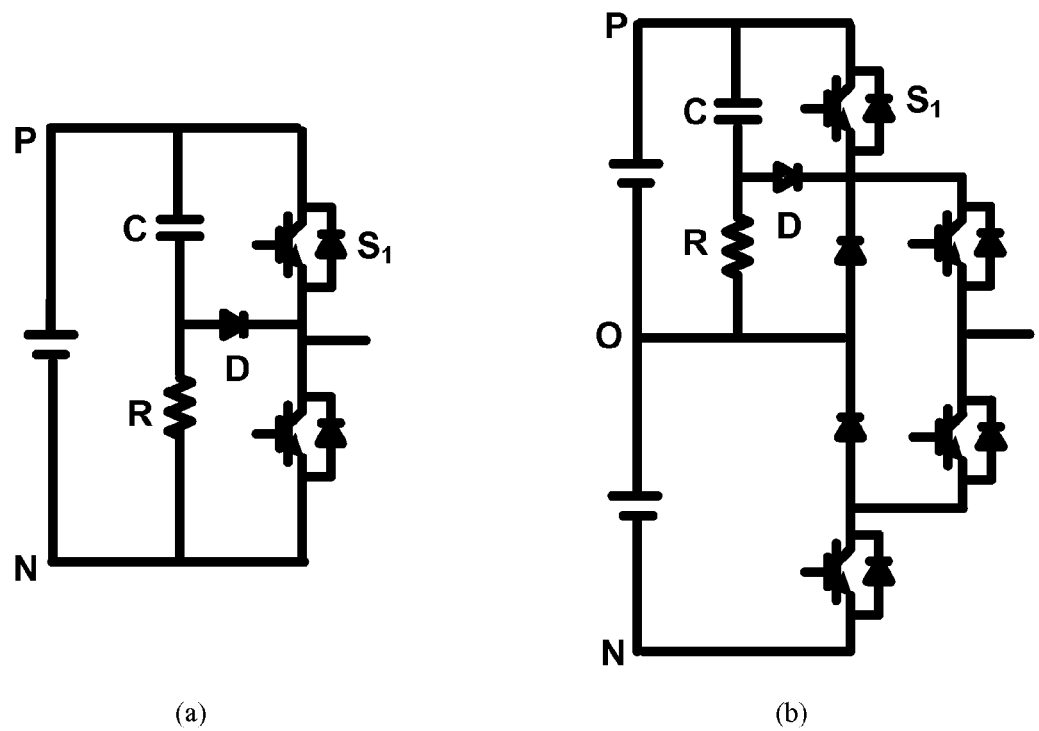
FIG. 5 illustrates an RCD voltage clamping circuit used for an internal switch $S_1$ in a two-level and three-level Neutral Point Clamped (NPC) type converter.
Figure 6:
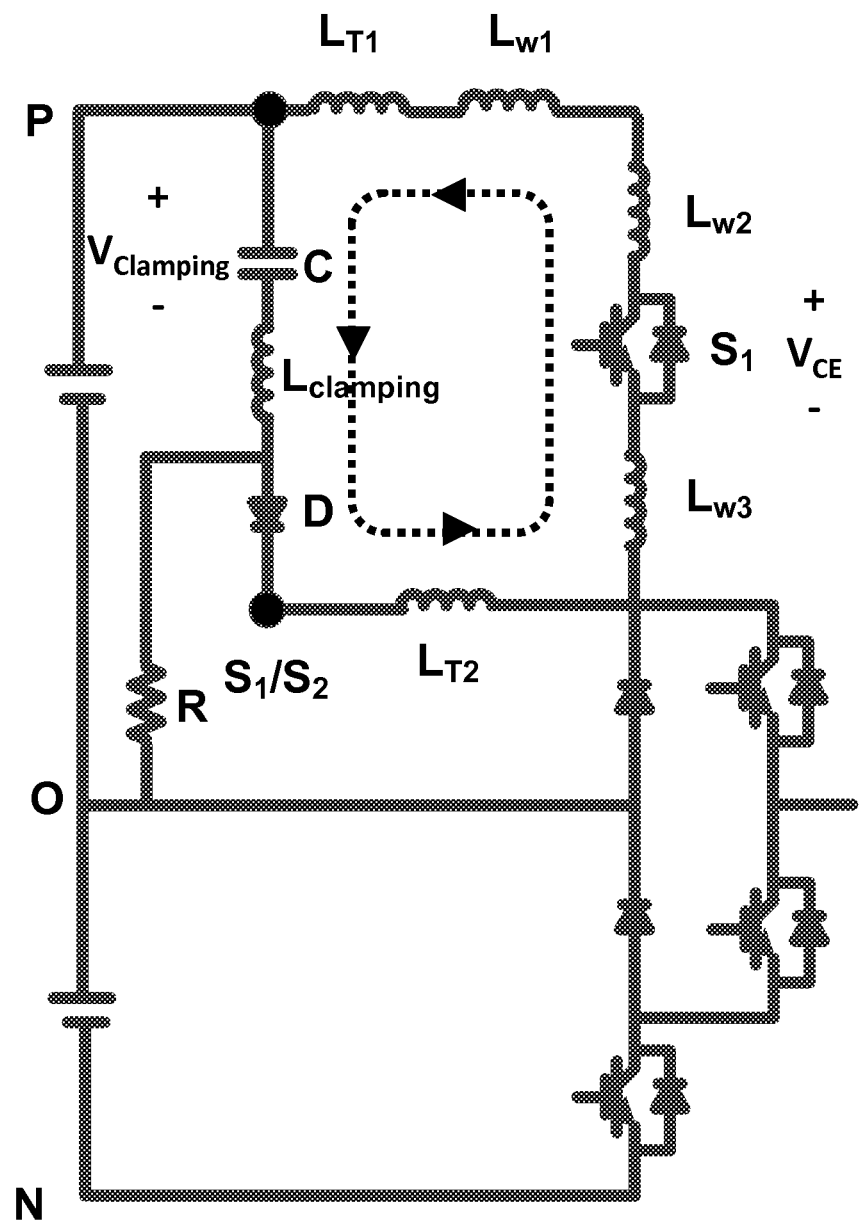
FIG. 6 illustrates an equivalent circuit showing a three-level NPC converter which employs a voltage clamping circuit including parasitic inductances.

Through an example where an internal circuit of a power module is a three-level NPC converter, FIG. 6 illustrates an equivalent circuit showing a voltage clamping circuit including parasitic inductances and used for a switch $S_1$ in the three-level NPC converter. As shown in FIG. 6, the voltage clamping circuit employed in the three-level NPC converter is as shown in FIG. 4(a) in which components of a charging loop include a voltage clamping capacitor C and a diode D connected in series, and components of a discharging loop include the voltage clamping capacitor C and a resistor R connected in series. The components of the charging loop are connected between an external lead terminal P and an external lead terminal $S_1/S_2$. $L_{T1}$ is a parasitic inductance of the external lead terminal P, $L_{T2}$ are parasitic inductances of the external lead terminal $S_1/S_2$, $L_{W1}$ is a parasitic inductance between the external terminal P and a base plane of the power module, $L_{W2}$ is a parasitic inductance of wires around $S_1$, and $L_{W3}$ is the parasitic inductance between the external lead terminal $S_1/S_2$ and the base plane of the power module.

At the moment when S is turned off, the instantaneous voltage detected between the external lead terminals P and $S_1/S_2$ is approximately to be:

$$V_{sensed} = V_{clamping} + L_{clamping} \frac{di}{dt},$$

wherein $L_{clamping}$ is the parasitic inductance of the charging loop. Further referring to FIG. 6, the instantaneous voltage ($V_{CE}$) actually applied across the switch $S_1$ is:

$$V_{CE} = V_{clamping} + (L_{clamping} + L_{T1} + L_{T2} + L_{W1} + L_{W2} + L_{W3}) \frac{di}{dt}.$$

$V_{CE}$ is actually larger than the instantaneous voltage detected externally between the lead terminals P and $S_1/S_2$, and the difference value $\Delta V$ between the two is:

$$\Delta V = (L_{T1} + L_{T2} + L_{W1} + L_{W2} + L_{W3})\frac{di}{dt}.$$

And this is the additional voltage generated by the internal parasitic inductance.

Figure 7:
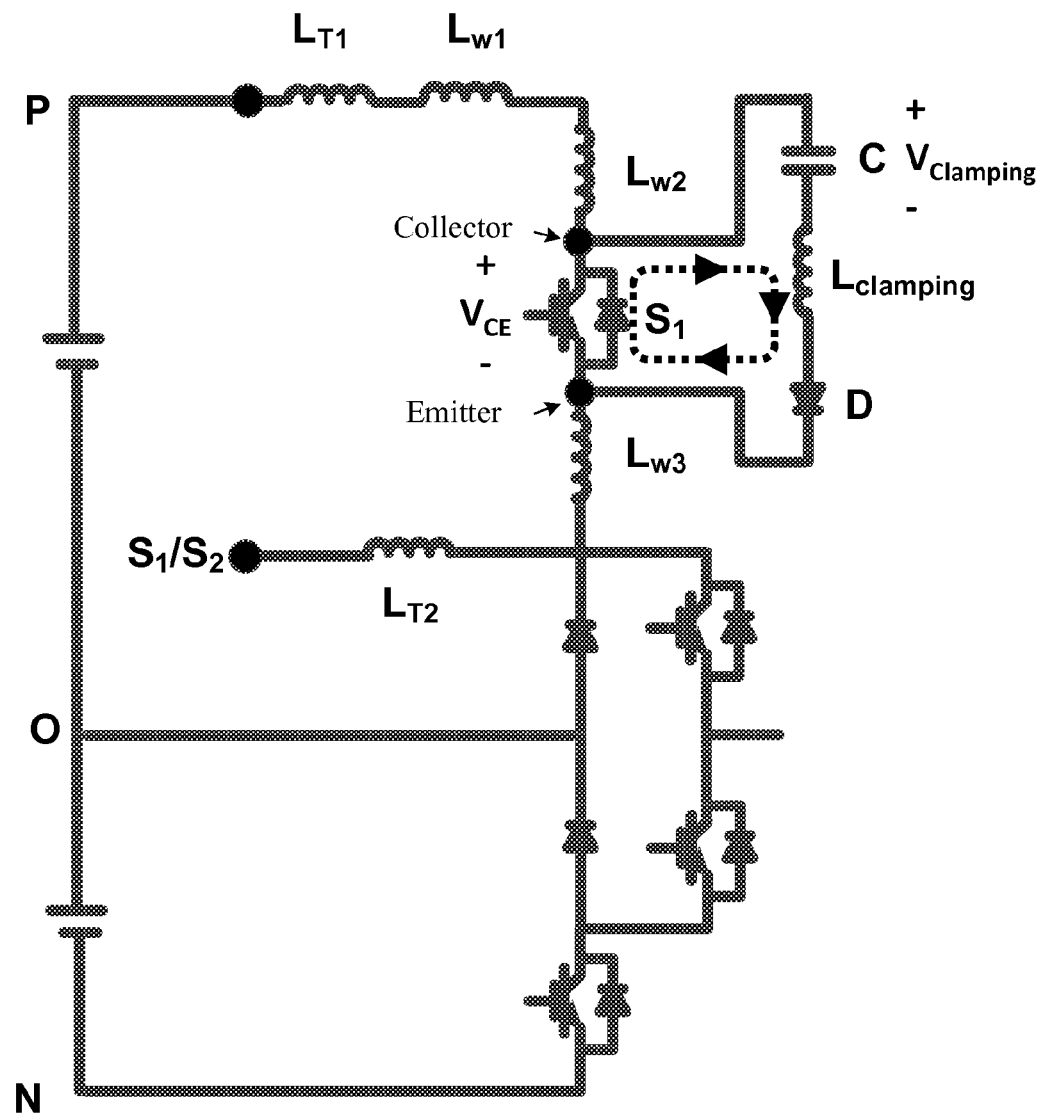
FIG. 7 illustrates an equivalent circuit of an ideal settings of a voltage clamping circuit.

In order to lower $\Delta V$, the parasitic inductance needs to be minimized. FIG. 7 illustrates an equivalent circuit of an ideal setting of a voltage clamping circuit. As shown in FIG. 7, if the charging loop of the voltage clamping circuit is disposed near to the collector and the emitter of the switch $S_1$, $V_{CE}$ is:

$$V_{CE} = V_{clamping} + L_{clamping}\frac{di}{dt}.$$

That is to say, $V_{CE}$ equals to the instantaneous voltage externally detected between the lead terminals P and $S_1/S_2$.

The present disclosure provides a power module to decrease the influence caused by the parasitic inductances in circuits, thereby lower the instantaneous voltage borne by the switch, by reasonably disposing the position of the voltage clamping circuit, especially the positions of the components in the charging loop. Thus, the reliability of the power module may be improved, the size of the power module may be reduced and thereby a higher power density may be achieved.

Taking a case where a voltage clamping circuit is used for an internal switch $S_1$ of a power module as an example, the position relationship between the voltage clamping circuit used for the switch $S_1$ and the switch $S_1$ is explained in detailed in the following embodiments. Voltage clamping circuits used for other switching components in the power module will not be described in detailed or with reference to drawings.

It shall be noted that although the following embodiments are illustrated by an example of RCD voltage clamping circuit, i.e., its charging loop includes a clamping capacitor C and a switch D, the present disclosure is also applicable to other voltage clamping circuits, for example, the RC voltage snubber circuit (i.e., its charging loop includes a clamping capacitor C and a resistor R) and a C voltage snubber circuit (i.e., its charging loop includes only a clamping capacitor C). For the methods applicable to the charging loops, illustration is made only by taking an example of the clamping circuit including clamping capacitor C and the switch D, and the differences among the methods will be explained additionally. Furthermore, although the RCD voltage clamping circuit is illustrated with an example of a diode D, the present disclosure is not limited to this, that is, the RCD voltage clamping circuit of the present disclosure may also employ other switches such as MOSFET or BJT (Bipolar Junction Transistor).

The First Embodiment

In a power module, pins $P_1$ and $P_2$ of a voltage clamping circuit are provided besides an internal switch $S_1$, to connect the voltage clamping circuit to an internal circuit of the power module, thereby the charging loop of the voltage clamping circuit is provided to a collector and an emitter of the switch $S_1$.

For example, the pin $P_1$ may be provided close to a position of the collector of the switch $S_1$, and the pin $P_2$ may be provided close to a position of the emitter of the switch $S_1$, and the present disclosure is not limited to this.

The pins $P_1$ and $P_2$ here are different from the external pins P and $S_1/S_2$ used for energy transferring, but are used to connect the charging loop circuit to internal circuits of the power module. Although the pins $P_1$ and $P_2$ also have parasitic inductances $L_{P1}$ and $L_{P2}$, the values of the two inductances are significantly smaller than the parasitic inductances generated by the lead terminals and wires in the power module, since the pins $P_1$ and $P_2$ are more close to the switch $S_1$.

Since the pins $P_1$ and $P_2$ can not be directly disposed on a surface of the switch chip, there exist a parasitic inductance $L_{W1}'$ between the pin $P_1$ and the base plane of the power module and a parasitic inductance $L_{W2}'$ between the pin $P_2$ and the base plane of the power module.

Figure 8:
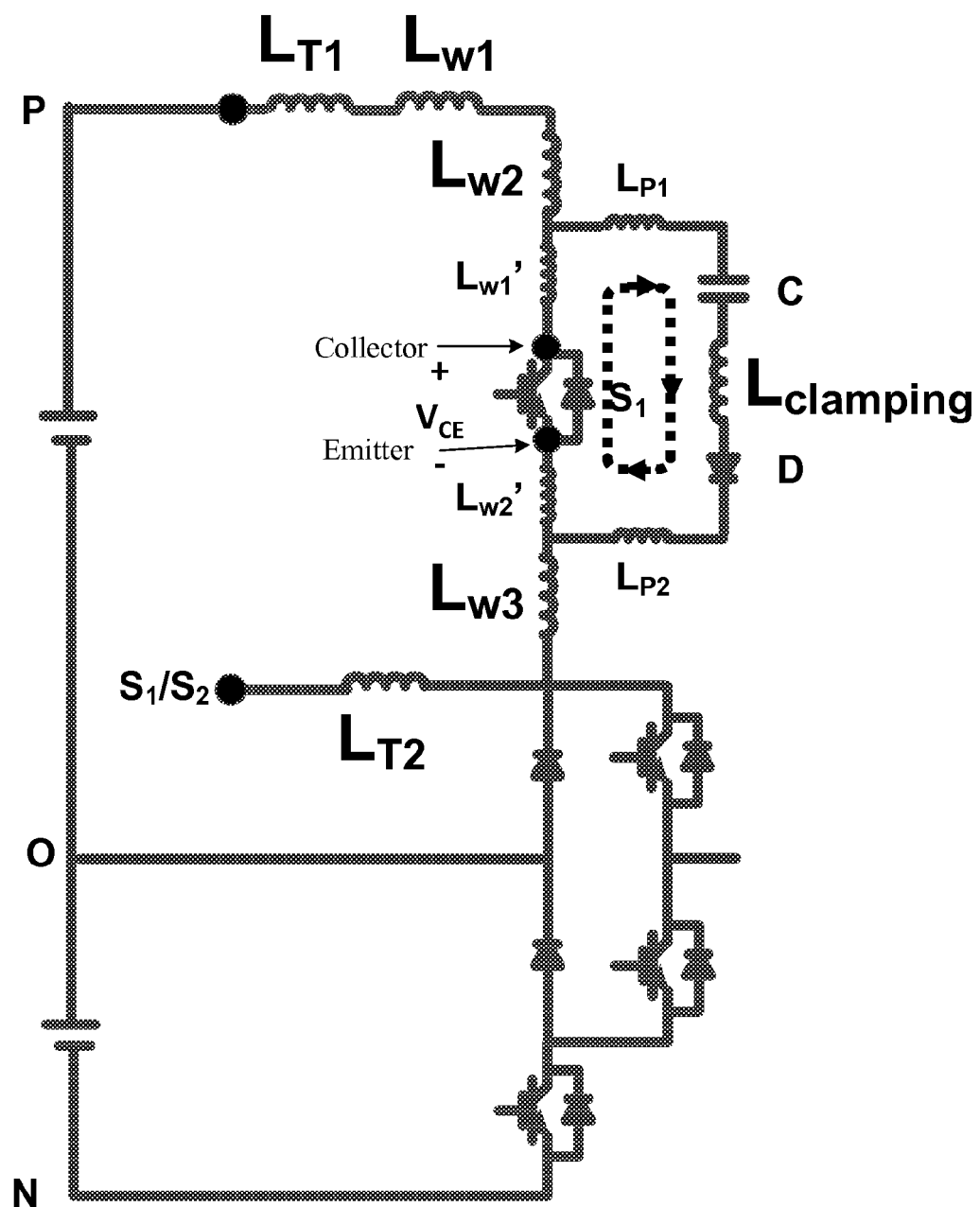
FIG. 8 illustrates an equivalent circuit of settings of a voltage clamping circuit of a power module according to a first embodiment of the present disclosure.

FIG. 8 illustrates an equivalent circuit of a voltage clamping circuit of an internal switch of a power module according the first embodiment of the present disclosure. As shown in FIG. 8, $V_{CE}$ is:

$$V_{CE} = V_{clamping} + (L_{clamping} + L_{P1} + L_{P2} + L_{W1}' + L_{W2}')\frac{di}{dt}.$$

The more the pins $P_1$ and $P_2$ close to the switch $S_1$, the smaller the parasitic inductances $L_{W1}'$ and $L_{W2}'$ are, thereby the smaller the parasitic inductance $L_{clamping}$ of the charging loop of the voltage clamping circuit is. In order to reduce the parasitic inductances $L_{W1}'$ and $L_{W2}'$, the present disclosure limits the settings of the pins $P_1$ and $P_2$.

Figure 9:
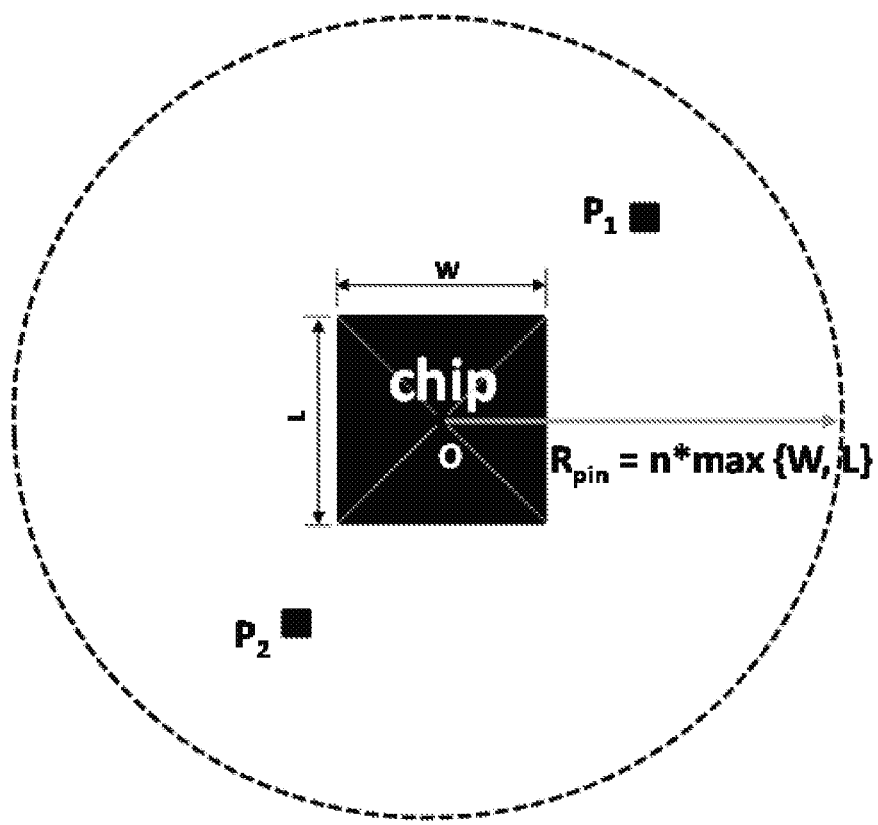
FIG. 9 illustrates a schematic diagram of settings of pins when a single switch chip is employed according to the first embodiment of the present disclosure.

FIG. 9 illustrates a schematic diagram of settings of pins of the voltage clamping circuit used for the switch $S_1$ as shown in FIG. 8 according to the first embodiment of the present embodiment. In FIG. 9, the switch $S_1$ (such as an IGBT, a MOSFET, or a diode) is provided on the base plane of the power module in a form of a switch chip, and the switch chip is always with a rectangle or square shape.

As shown in FIG. 9, it is provided that a center point of the switch chip with a rectangle or square shape is O, which is the intersection point of two diagonals of the rectangle or the square, and it is provided that a width of the rectangle is W, and a length of the rectangle is L, and W equals to L for the square. For clearness of description, a circle is defined with the center point O as a center of the circle and a value which is n times of a maximum one of W and L as a radius, i.e., the radius of the circle is $R_{pin} = n \times \max\{W, L\}$, wherein n may be 0.5, 1, 1.5, 2, 2.5 and so on. The pins $P_1$ and $P_2$ of the voltage clamping circuit are disposed within the circle to reduce the parasitic inductance $L_{W1}'$ and $L_{W2}'$.

According to a preferred embodiment of the present disclosure, when n=2, the parasitic inductances $L_{W1}'$ and $L_{W2}'$ may be minimized. If the pins $P_1$ and $P_2$ of the voltage clamping circuit are disposed within the circle, the inductances $L_{W1}'$ and $L_{W2}'$ are only in nano-Henry orders, which can nearly be neglected.

According to experiments, when the voltage clamping circuit is disposed according to the first embodiment of the present disclosure, if the current when the switching component is turned off is 150 A, the voltage between the collector and the emitter of the switch chip $S_1$ detected directly from the inside of power module is 344V, which is actually improved, compared with the voltage 413 V when the voltage clamping circuit is disposed according to the conventional technologies.

In order to increase the output power of the power module, two or more chips are usually connected in parallel; and in order to bear a larger voltage, two or more chips are connected in series. In order to clamp instantaneous voltages of a plurality of chips, the cases where a plurality of chips are connected in series or in parallel needs to be considered.

Figure 10:
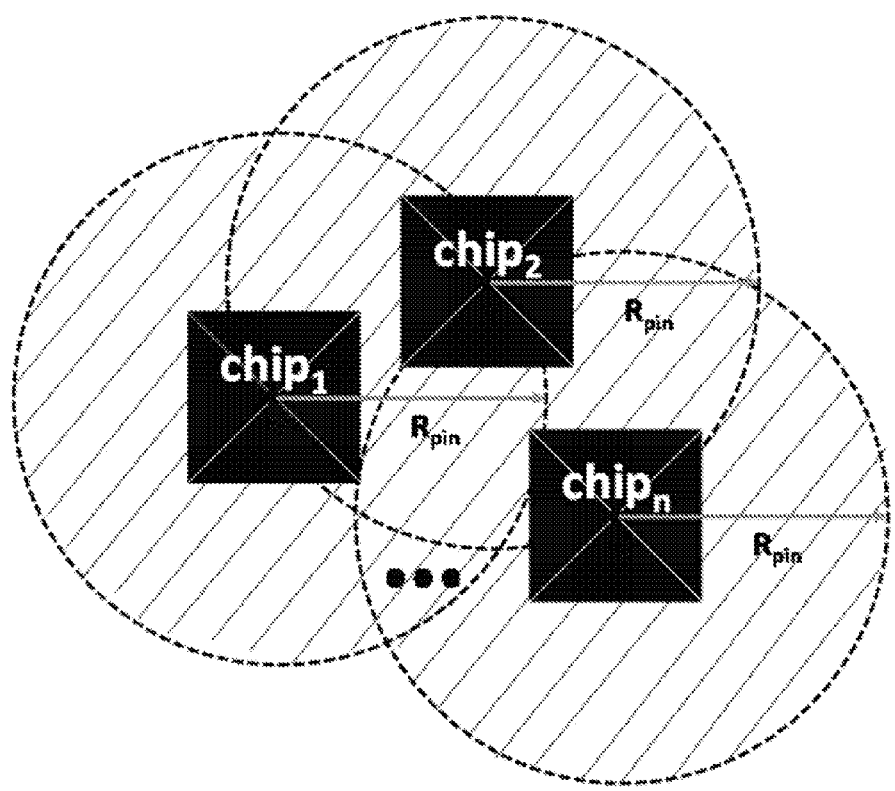
FIG. 10 illustrates a schematic diagram of settings of pins when a plurality of switch chips are connected in series or in parallel according to the first embodiment of the present disclosure.

FIG. 10 illustrates a schematic diagram of settings of pins of the voltage clamping circuit when a plurality of switch chips are connected in series or in parallel according to the first embodiment of the present disclosure. As shown in FIG. 10, for each of the switch chips ($chip_1$, $chip_2$, ..., $chip_n$), a circle may be defined according to the above method, i.e., by taking the center point of each chip as the center of the circle, and taking a value which is n times of a maximum one of the width and the length of each chip as the radius. The pins $P_1$ and $P_2$ of the voltage clamping circuit are disposed within any one circle, i.e., the hatched portion in this figure, so as to reduce the parasitic inductances $L_{W1}{}'$ and $L_{W2}{}'$.

In order to further reduce the parasitic inductance $L_{clamping}$ of the charging loop of the voltage clamping circuit, all or a part of the components of the charging loop may be assembled on the base plane of the power module, for example, the diode D and/or the clamping capacitor C are directly assembled on the base plane of the power module.

The Second Embodiment

A part of the components of the charging loop are assembled on the base plane of the power module, for example, the diode D or the clamping capacitor C is assembled on the base plane.

When the diode D is assembled on the base plane of the power module, the pins $P_1$ and $P_2$ are provided to the two sides of the clamping capacitor C to connect the clamping capacitor C to the assembled switch chip $S_1$ and the diode D.

Figure 11:
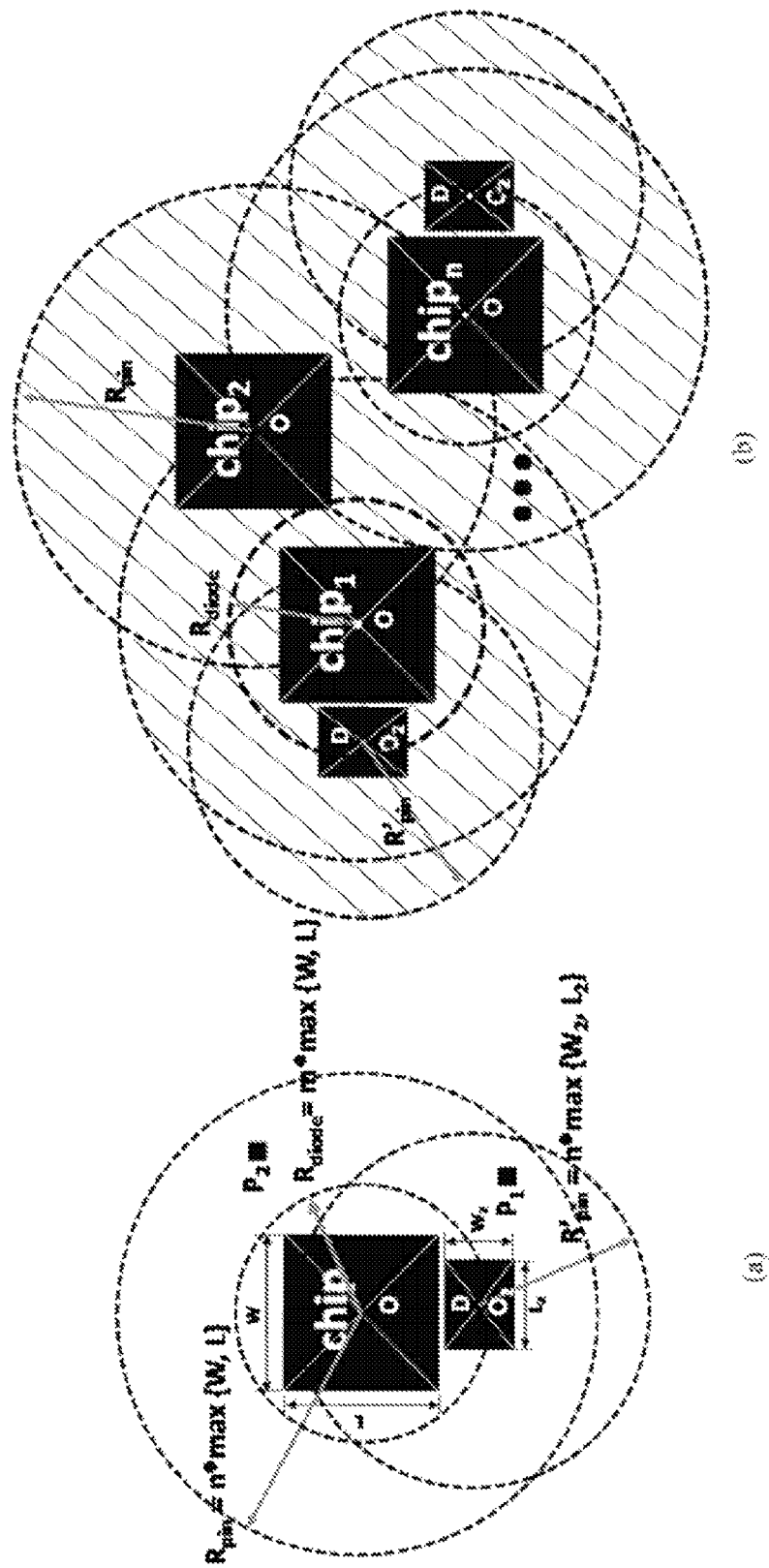
FIG. 11 illustrates a schematic diagram of a position setting of a diode of a power module on a base plane according to a second embodiment of the present disclosure.

FIG. 11 illustrates a schematic diagram of settings of pins of the voltage clamping circuit in the power module when a diode is assembled on the base plane of the power module according to the second embodiment of the present disclosure. FIG. 11(a) illustrates a schematic diagram of a single switch chip, and FIG. 11(b) illustrates a schematic diagram when a plurality of switch chips ($chip_1$, $chip_2$, ..., and $chip_n$) are connected in series or in parallel.

As shown in FIG. 11(a), a center point $O_2$ of the diode D is disposed within a circle, defined with the center point O of the switch chip $S_1$ as the center of the circle, and a value which is m times of a maximum one of the width W and the length L of the switch chip $S_1$ as the radius of the circle, i.e., the radius of the circle is $R_{diode}=m \times \max\{W, L\}$, wherein m may be 0.5, 0.8, 1 and so on.

According to a preferred embodiment of the present disclosure, when m=0.8, a parasitic inductance between the switch chip $S_1$ and the diode chip D may be minimized.

Similar to the switch chip $S_1$ in the first embodiment, the above method is also applicable to the diode chip D. The pins $P_1$ and $P_2$ may be disposed within a position area, i.e., within a circle, defined with the center point $O_2$ of the diode chip D as the center of the circle, and a value which is n times of a maximum one of the width $W_2$ and the length $L_2$ of the diode chip D as the radius of the circle, i.e., $R'_{pin}=n \times \max\{W_2,L_2\}$, wherein n may also be 0.5, 1, 1.5, 2 and so on, and for example, n=2.

Thus, the pins $P_1$ and $P_2$ may be located within the circle, defined with the center point of the switch chip $S_1$ as the center of the circle, and $R_{pin}=n \times \max\{W,L\}$ as the radius, or may be located within the circle, defined with the center point $O_2$ of the diode chip D as the center of the circle, and $R'_{pin}=n \times \max\{W_2,L_2\}$ as the radius of the circle, wherein n may be 0.5, 1, 1.5, 2 and so on, and for example, n=2.

It shall be noted that, if the diode chip D is replaced with a resistor R, when the resistor R is assembled on the base plane of the power module, the pins $P_1$ and $P_2$ are provided to the two sides of the clamping capacitor C to connect the clamping capacitor C to the assembled switch chip $S_1$ and the resistor R.

The center point of the resistor R is disposed within a circle, defined with the center point O of the switch chip $S_1$ as a center of the circle, and a value which is n times of a maximum one of the width W and the length L of the switch chip $S_1$ as the radius of the circle, i.e., the radius of the circle is $R_{resistor}=n \times \max\{W, L\}$, wherein n may be 0.5, 1, 1.5, 2 and so on, and for example, n=2.

The setting method of the pins $P_1$ and $P_2$ is the same as the case where the capacitor C and the diode D are the components of the charging loop, i.e., the pins $P_1$ and $P_2$ may also be located within a circle, defined with the center point of the resistor R as the center of the circle, and the value which is n times of a maximum one of the length and width of the resistor R as the radius.

As shown in FIG. 11(b), when the voltage clamping circuits clamp a plurality of switch chips which are connected in series or in parallel, the center point of the diode chip D may be located within a circle, defined with the center point O of any one switch chip as the center of the circle, and $R_{diode}=m \times \max\{W, L\}$ as the radius, wherein W and L are the width and the length of the switch chip respectively.

The pins $P_1$ and $P_2$ may be located within a circle, defined with the center point O of any one switch chip as the center of the circle, and $R_{pin}=n \times \max\{W,L\}$ as the radius, or the pins $P_1$ and $P_2$ may be located within a circle, defined with the center point $O_2$ of the diode chip D as the center of the circle, and $R'_{pin}=n \times \max\{W_2,L_2\}$ as the radius.

Similarly, it shall be noted that, if the diode chip D is replaced with a resistor R, the center point of the resistor R may be located within a circle, defined with the center point O of any one switch chip as the center of the circle, and $R_{resistor}=n \times \max\{W, L\}$ as the radius, wherein W and L are the width and the length of the switch chip respectively. Under such circumstance, the pins $P_1$ and $P_2$ may be located within a circle, defined with the center point O of any one switch chip as the center of the circle, and $R_{pin}=n \times \max\{W, L\}$ as the radius, or the pins $P_1$ and $P_2$ may be located within a circle, defined with the center point of the resistor as the center of the circle, and the value which is n times of a maximum one of the length and the width of the resistor R as the radius.

When the clamping capacitor C is directly assembled on the base plane of the power module, the pins $P_1$ and $P_2$ are provided to the two sides of the diode D to connect the diode D to the assembled switch chip $S_1$ and the clamping capacitor C.

Under such circumstance, the center point $O_3$ of the clamping capacitor chip C is disposed within a circle, defined with the center point O of the switch chip $S_1$ as the center of the circle, and the value which is n times of a maximum one of the width W and the length L of the switch chip $S_1$ as the radius, i.e., the radius of the circle is $R_{cap}=n \times \max\{W, L\}$, wherein n may be 0.5, 1, 1.5, 2 and so on, and for example, n=2.

The pins $P_1$ and $P_2$ may be located within the circle, defined with the center point of the switch chip $S_1$ as the center of the circle, and $R_{pin}=n\times max\{W,L\}$ as the radius, or the pins $P_1$ and $P_2$ may be located within the circle, defined with the center point $O_3$ of the clamping capacitor chip C as the center of the circle, and $R''_{pin}=n\times max\{W_3,L_3\}$ as the radius, wherein $W_3$ and $L_3$ are the width and the length of the clamping capacitor chip C, and n may be 0.5, 1, 1.5, 2 and so on, and for example, n=2.

When the voltage clamping circuit clamps a plurality of switch chips connected in series or in parallel, the center point $O_3$ of the clamping capacitor chip C may be located in a circle, defined with the center point O of any one switch chip as the center of the circle, and $R_{cap}=n\times max\{W, L\}$ as the radius, wherein W and L are the width and the length of the switch chip respectively.

The pins $P_1$ and $P_2$ may be located within a circle, defined with the center point O of any one switch chip as the center of the circle, and $R_{pin}=n\times max\{W,L\}$ as the radius, or the pins $P_1$ and $P_2$ may be located within a circle, defined with the center point $O_3$ of the clamping capacitor chip C as the center of the circle, and $R''_{pin}=n\times max\{W_3,L_3\}$ as the radius.

In addition, in the present embodiment, a circuit board which is in parallel with and connected to the base plane of the power module may be provided, so as to assemble the diode chip D or the clamping capacitor chip C on the circuit board.

When the diode chip D is assembled on the circuit board, a projection of the center point of the diode chip D on the base plane of the power module is located in a circle, defined with the center point of the switch chip $S_1$ as the center of the circle, and $R_{diode}=m\times max\{W, L\}$ as the radius, wherein W and L are the width and the length of the switch chip $S_1$ respectively.

The pins $P_1$ and $P_2$ may be located within a circle, defined with a projection of the center point $O_2$ of the diode chip D on the base plane as the center of the circle, and $R'_{pin}=n\times max\{W_2,L_2\}$ as the radius; or the pins $P_1$ and $P_2$ may be located within a circle, defined with the center point O of any one switch chip as the center of the circle, and $R_{pin}=n\times max\{W,L\}$ as the radius.

Similarly, it shall be noted that, if the diode chip D is replaced with the resistor R, a projection of the center point of the resistor R on the base plane of the power module may be disposed within a circle, defined with the center point O of the switch chip $S_1$ as the center of the circle, and the value which is n times of a maximum one of the width W and the length L of the switch chip $S_1$ as the radius, i.e., the radius of the circle is $R_{resistor}=n\times max\{W, L\}$, wherein n may be 0.5, 1, 1.5, 2 and so on, and for example, n=2. Under such circumstance, the pins $P_1$ and $P_2$ may be located within a circle, defined with the center point O of any one switch chip as the center of the circle, and $R_{pin}=n\times max\{W,L\}$ as the radius, or the pins $P_1$ and $P_2$ may be located within a circle, defined with the center point of the resistor as the center of the circle, and a value which is n times of a maximum one of the length and the width of the resistor R as the radius.

When the clamping capacitor chip C is assembled on the circuit board, a projection of the center point of the clamping capacitor chip C on the base plane of the power module is located within a circle, defined with the center point of the switch chip $S_1$ as the center of the circle, and $R_{cap}=n\times max\{W, L\}$ as the radius, wherein W and L are the width and the length of the switch chip $S_1$ respectively.

The pins $P_1$ and $P_2$ may be located within a circle, defined with a projection of the center point $O_3$ of the clamping capacitor chip C on the base plane as the center of the circle, and $R''_{pin}=n\times max\{W_3,L_3\}$ as the radius; or the pins $P_1$ and $P_2$ may be within a circle, defined with the center point O of any one switch chip as the center of the circle, and $R_{pin}=n\times max\{W,L\}$ as the radius.

In the above first and second embodiments, components in the voltage clamping circuit may be disposed in the power device or outside the power device. When the pins $P_1$ and $P_2$ are long enough, the components of the charging loop may be disposed outside the power device to facilitate connection of users.

The Third Embodiment

All of the components of the charging loop may be assembled on the base plane of the power module, for example, the diode D and the clamping capacitor C are directly assembled on the base plane of the power module, to connect the charging loop of the voltage clamping circuit to the collector and the emitter of the switch $S_1$.

Since there is no need to use the pins $P_1$ and $P_2$ to connect the diode D and the clamping capacitor C to the base plane of the power module, the only parasitic inductance is the parasitic inductance $L_{plane}$ of the base plane, which exists on the connection between the switch chip $S_1$ and the diode D and the clamping capacitor C.

Figure 12:
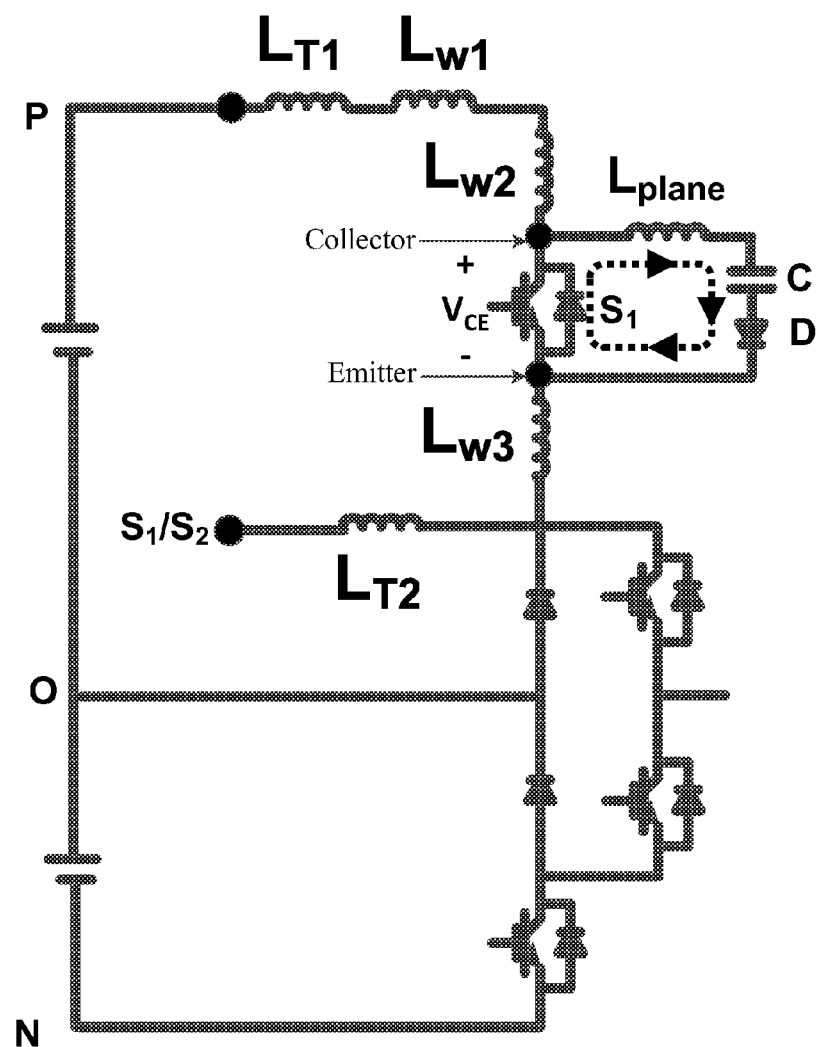
FIG. 12 illustrates an equivalent circuit of settings of a voltage clamping circuit of a power module according a third embodiment of the present disclosure.

FIG. 12 illustrates an equivalent circuit of settings of a voltage clamping circuit of a power module according the third embodiment of the present disclosure. As shown in FIG. 12, $V_{CE}$ is:

$$V_{CE} = V_{clamping} + L_{plane}\frac{di}{dt} \approx V_{clamping}.$$

Under such circumstance, no voltage spike occurs on the switch $S_1$.

Figure 13:
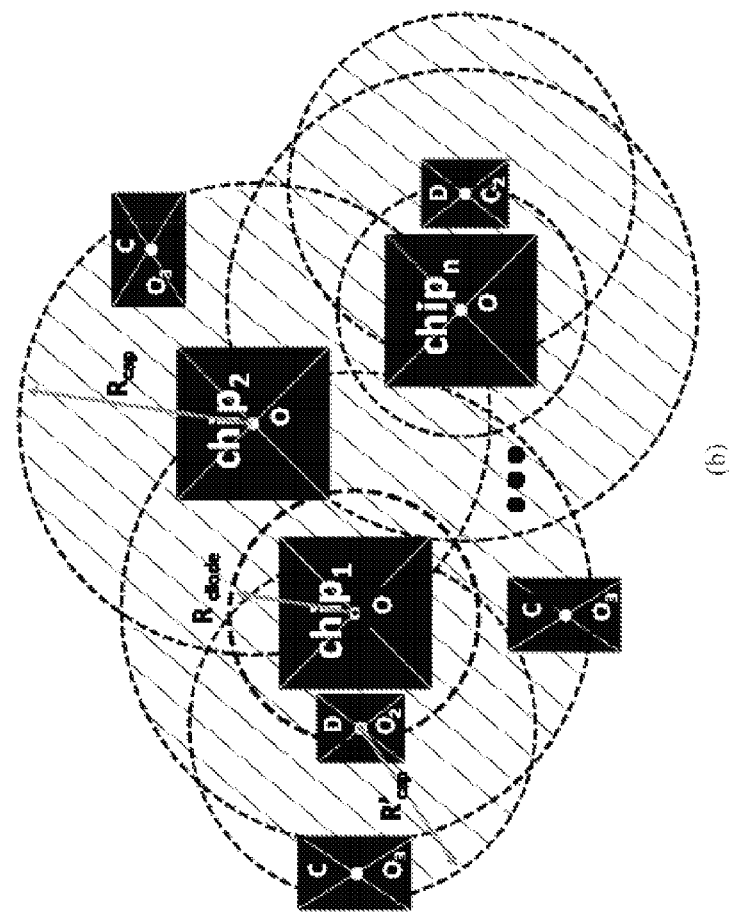
FIG. 13 illustrates a schematic diagram of position settings of a diode and a capacitor of a power module on a base plane according to the third embodiment of the present disclosure.
Figure 13:
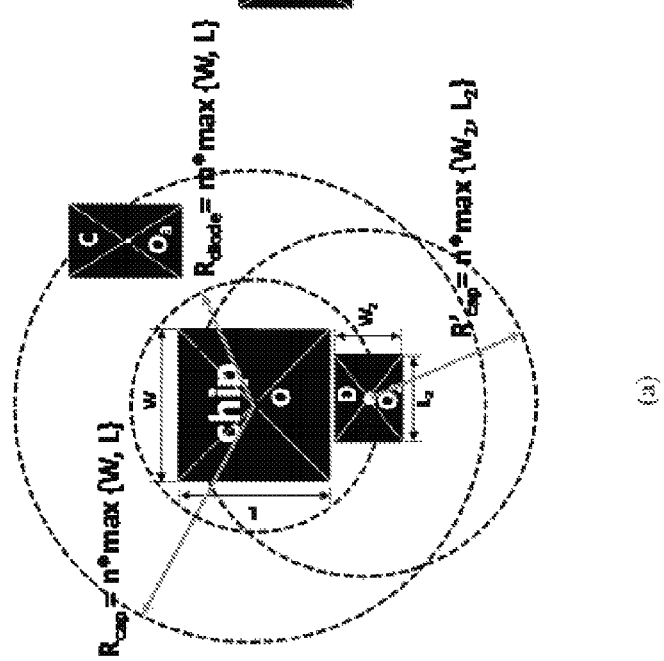

FIG. 13 illustrates a schematic diagram of position settings of the voltage clamping circuit in the power module when the diode and the capacitor are assembled on the base plane of the power module according to the third embodiment of the present disclosure. FIG. 13(a) illustrates the position schematic diagram of the components of the charging loop when a single switch chip is employed, and FIG. 13(b) illustrates a position schematic diagram of the components of the charging loop when a plurality of switch chips ($chip_1$, $chip_2$, ..., $chip_n$) connected in series or in parallel are employed.

As shown in FIG. 13(a), the center point $O_2$ of the diode D is disposed within a circle, defined with the center O of the switch chip $S_1$ as the center of the circle, and a value which is m times of a maximum one of the width W and the length L of the switch chip $S_1$ as the radius, i.e., the radius of the circle is $R_{diode}=m\times max\{W, L\}$, wherein m may be 0.5, 0.8, or 1 and so on, and for example, m=0.8.

In one embodiment, the center point $O_3$ of the clamping capacitor chip C may be disposed within a circle, defined with the center point O of the switch chip $S_1$ as the center of the circle, and a value which is n times of a maximum one of the width W and the length L of the switch chip $S_1$ as the radius, i.e., the radius of the circle is $R_{cap}=n\times max\{W, L\}$, wherein n may be 0.5, 1, 1.5, 2 and so on, and for example, n=2.

In another embodiment, the center point $O_3$ of the clamping capacitor chip C may be disposed within a circle, defined with the center point $O_2$ of the diode D as the center of the circle, and the value which is n times of a maximum one of the width $W_2$ and the length $L_2$ of the diode D as the radius, i.e., the radius of the circle is $R'_{cap}=n\times\max\{W_2, L_2\}$, n may be 0.5, 1, 1.5, 2 and so on, and for example, n=2.

Similarly, it shall be noted that, if the diode chip D is replaced with a resistor R, the center point of the resistor R is disposed within a circle, defined with the center point O of the switch chip $S_1$ as the center of the circle, and the value which is n times of a maximum one of the width W and length L of the switch chip $S_1$ as the radius, i.e., the radius of the circle is $R_{resistor}=n\times\max\{W, L\}$, wherein n may be 0.5, 1, 1.5, 2 and so on, and for example, n=2.

Under such circumstance, in one embodiment, the center point $O_3$ of the clamping capacitor chip C is disposed within a circle, defined with the center point O of the switch chip $S_1$ as the center of the circle, and a value which is n times of a maximum one of the width W and the length L of the switch chip S1 as the radius, i.e., the radius of the circle is $R_{cap}=n\times\max\{W, L\}$), wherein n may be 0.5, 1, 1.5, 2 and so on, and for example, n=2.

In another embodiment, the center point $O_3$ of the clamping capacitor chip C is disposed within a circle, defined with the center of the resistor R as the center of the circle, and a value which is n times of a maximum one of the width and the length of the resistor as the radius, wherein n may be 0.5, 1, 1.5, 2 and so on, and for example, n=2.

As shown in FIG. 13(b), when the voltage clamping circuit clamps a plurality of switch chips connected in series or in parallel, the center of the diode chip D may be disposed within a circle, defined with the center point O of any one switch chip as the center of the circle, and $R_{diode}=m\times\max\{W, L\}$ as the radius of the circle, wherein W and L are the width and the length of the switch chip respectively.

In one embodiment, the center point $O_3$ of the clamping capacitor chip C may be disposed within a circle, defined with the center point O of any one switch chip as the center of the circle, and $R_{cap}=n\times\max\{W, L\}$ as the radius, wherein W and L are the width and the length of the switch chip respectively.

In another embodiment, the center point $O_3$ of the voltage clamping capacitor chip C may be disposed within a circle, defined with the center point $O_2$ of the diode D as the center of the circle, and $R'_{cap}=n\times\max\{W_2, L_2\}$ as the radius, wherein $W_2$ and $L_2$ are the width and the length of the diode D respectively.

Similarly, it shall be noted that, if the diode chip D is replaced with the resistor R, the center point of the resistor R may be located within a circle, defined with the center point O of any one switch chip as the center of the circle, and $R_{resistor}=n\times\max\{W, L\}$ as the radius, wherein W and L are the width and the length of the switch chip respectively.

Under such circumstance, in one embodiment, the center point $O_3$ of the clamping capacitor chip C may be located within a circle, defined with the center point O of any one switch chip as the center of the circle, and $R_{cap}=n\times\max\{W, L\}$, wherein W and L are the width and length of the switch chip.

In another embodiment, the center point $O_3$ of the clamping capacitor chip C may be disposed within a circle, defined with the center point of the resistor R as the center of the circle, and a value which is n times of a maximum one of the width and the length of the resistor as the radius.

In addition, in the present embodiment, a circuit board which is in parallel with and connected to the base plane of the power module may be provided, so as to assemble the diode chip D and/or the clamping capacitor chip C on the circuit board.

When the diode chip D and the clamping capacitor C are assembled on the circuit board, a projection of the center point $O_2$ of the diode chip D on the base plane of the power module is located in a circle, defined with the center point of the switch chip $S_1$ as the center of the circle, and $R_{diode}=m\times\max\{W, L\}$ as the radius, wherein W and L are the width and the length of the switch chip $S_1$ respectively.

In one embodiment, a projection of the center point $O_3$ of the clamping capacitor chip C on the base plane of the power module is located within a circle, defined with the center point of the switch chip $S_1$ as the center of the circle, and $R_{cap}=n\times\max\{W, L\}$ as the radius, wherein W and L are the width and the length of the switch chip $S_1$ respectively.

In another embodiment, a projection of the center point $O_3$ of the clamping capacitor chip C on the base plane of the power module is located within a circle, defined with a projection of the center point $O_2$ of the diode D on the base plane of the power module as the center of the circle, and $R'_{cap}=n\times\max\{W_2, L_2\}$ as the radius, wherein $W_2$ and $L_2$ are the width and the length of the diode D respectively.

Similarly, it shall be noted that, if the diode chip D is replaced with the resistor R, a projection of the center point of the resistor R on the base plane of the power module may be disposed within a circle, defined with the center point O of the switch chip $S_1$ as the center of the circle, and the value which is n times of a maximum one of the width W and the length L of the switch chip $S_1$ as the radius, i.e., the radius of the circle is R i=$n\times\max\{W, L\}$, wherein n may be 0.5, 1, 1.5, 2 and so on, and for example, n=2. Under such circumstance, the position of the clamping capacitor chip C here is the same as the position of the above clamping capacitor chip C, so its detailed descriptions are omitted.

When the diode chip D is assembled on the circuit board and the clamping capacitor C is assembled on the base plane of the power module, a projection of the center point $O_2$ of the diode chip D on the base plane of the power module is located within a circle, defined with the center point of the switch chip $S_1$ as the center of the circle, and $R_{diode}=m\times\max\{W, L\}$ as the radius, wherein W and L are the width and the length of the switch chip $S_1$ respectively.

In one embodiment, the center point $O_3$ of the clamping capacitor chip C is located within a circle, defined with the center point of the switch chip $S_1$ as the center of the circle, and $R_{cap}=n\times\max\{W, L\}$ as the radius, wherein W and L are the width and the length of the switch chip $S_1$ respectively.

In another embodiment, the center point $O_3$ of the clamping capacitor chip C is located within a circle, defined with a projection of the center point $O_2$ of the diode D on the base plane of the power module as the center of the circle, and $R'_{cap}=n\times\max\{W_2, L_2\}$ as the radius, wherein $W_2$ and $L_2$ are the width and the length of the diode D respectively.

Similarly, it shall be noted that, if the diode chip D is replaced with the resistor R, a projection of the center point of the resistor R on the base plane of the power module may be disposed within a circle, defined with the center point O of the switch chip $S_1$ as the center of the circle, and the value which is n times of a maximum one of the width W and the length L of the switch chip $S_1$ as the radius, i.e., the radius of the circle is $R_{resistor}=n\times\max\{W, L\}$, wherein n may be 0.5, 1, 1.5, 2 and so on, and for example, n=2. Under such circumstance, the position of the clamping capacitor chip C here is the same as the position of the above clamping capacitor chip C, so its detailed descriptions are omitted.

When the diode chip D is assembled on base plane of the power module and the clamping capacitor C is assembled on the circuit board, the center point $O_2$ of the diode chip D is located within a circle, defined with the center point of the switch chip $S_1$ as the center of the circle, and $R_{diode}$=m×max{W, L} as the radius, wherein W and L are the width and the length of the switch chip $S_1$ respectively.

In one embodiment, a projection of the center point $O_3$ of the clamping capacitor chip C on the base plane of the power module is located within a circle, defined with the center point of the switch chip $S_1$ as the center of the circle, and $R_{cap}$=n×max{W, L} as the radius, wherein W and L are the width and the length of the switch chip $S_1$ respectively.

In another embodiment, a projection of the center point $O_3$ of the clamping capacitor chip C on the base plane of the power module is located within a circle, defined with the center point $O_2$ of the diode D as the center of the circle, and $R'_{cap}$=n×max{$W_2$, $L_2$} as the radius, wherein $W_2$ and $L_2$ are the width and the length of the diode D respectively.

Similarly, it shall be noted that, if the diode chip D is replaced with the resistor R, the center point of the resistor R may be disposed within a circle, defined with the center point O of the switch chip $S_1$ as the center of the circle, and the value which is n times of a maximum one of the width W and the length L of the switch chip $S_1$ as the radius, i.e., the radius of the circle is $R_{resistor}$=n×max{W, L}, wherein n may be 0.5, 1, 1.5, 2 and so on, and for example, n=2. Under such circumstance, the position of the clamping capacitor chip C here is the same as the position of the above clamping capacitor chip C, so its detailed descriptions are omitted.

In actual applications, the positions of the components of the charging loop (i.e., the capacitor c and the diode D) may be set as follows:

When the diode chip D and the clamping capacitor C are assembled on base plane, the center point $O_3$ of clamping capacitor C is disposed within a circle, defined with the center point O of the switch chip $S_1$ as the center of the circle, and the value which is n times of a maximum one of the width W and the length L of the switch chip $S_1$ as the radius, i.e., the radius of the circle is $R_{cap}$=m×max{W, L}, wherein n may be 0.5, 1, 1.5, 2 and so on, and for example, n=2.

The center point $O_2$ of the diode chip D is disposed within a circle, defined with the center point O of the switch chip $S_1$ as the center of the circle, and the value which is m times of a maximum one of the width W and the length L of the switch chip $S_1$ as the radius, i.e., the radius of the circle is $R_{diode}$=m×max{W, L}, wherein n may be 0.5, 0.8 or 1 and so on, and for example, m=0.8.

Similarly, it shall be noted that, if the diode chip D is replaced with the resistor R, the center point of the resistor R may be disposed within a circle, defined with the center point O of the switch chip $S_1$ as the center of the circle, and the value which is n times of a maximum one of the width W and the length L of the switch chip $S_1$ as the radius, i.e., the radius of the circle is $R_{resistor}$=n×max{W, L}, wherein n may be 0.5, 1, 1.5, 2 and so on, and for example, n=2.

Otherwise, the center point $O_2$ of the diode chip D is disposed within a circle, defined with the center point $O_3$ of the clamping capacitor chip C as the center of the circle, and the value which is n times of a maximum one of the width $W_3$ and the length $L_3$ of the clamping capacitor C as the radius, i.e., the radius of the circle is $R'_{diode}$=n×max{$W_3$, $L_3$}, wherein n may be 0.5, 1, 1.5, 2 and so on, and for example, n=2.

When the voltage clamping circuit clamps a plurality of switch chips connected in series or in parallel, the clamping capacitor chip C may be located within a circle, defined with the center point O of any one switch chip as the circle, and $R_{cap}$=n×max{W, L} as the radius, wherein W and L are the width and the length of the switch chip respectively.

The center point $O_2$ of diode chip may be located within a circle, defined with the center point O of any one switch chip as the center of the circle, and $R_{diode}$=m×max{W, L} as the radius, wherein W and L are the width and the length of the switch chip respectively.

Similarly, it shall be noted that, if the diode chip D is replaced with the resistor R, the center point of the resistor R may be disposed within a circle, defined with the center point O of any one switch chip as the center of the circle, and the value which is n times of a maximum one of the width W and the length L of the switch chip as the radius, i.e., the radius of the circle is $R_{resistor}$=n×max{W, L}, wherein n may be 0.5, 1, 1.5, 2 and so on, and for example, n=2.

Otherwise, the center point $O_2$ of the diode chip D is disposed within a circle, defined with the center point $O_3$ of the clamping capacitor chip C as the center of the circle, and $R'_{diode}$=n×max{$W_3$, $L_3$} as the radius, wherein $W_3$ and $L_3$ are the width and the length of clamping capacitor chip C respectively.

Furthermore, a circuit board which is in parallel with and connected to the base plane of the power module may be provided, so as to assemble the diode chip D and/or the clamping capacitor chip C on the circuit board.

When clamping capacitor chip C and the diode chip D are assembled on the circuit board, a projection of the center point $O_3$ of the clamping capacitor C on the base plane of the power module is located in a circle, defined with the center point of the switch chip $S_1$ as the center of the circle, and $R_{cap}$=m×max{W, L} as the radius, wherein W and L are the width and the length of the switch chip $S_1$ respectively.

A projection of the center point $O_2$ of the diode chip D on the base plane of the power module is located within a circle, defined with the center point of the switch chip $S_1$ as the center of the circle, and $R_{diode}$=n×max{W, L} as the radius, wherein W and L are the width and the length of the switch chip $S_1$ respectively.

Similarly, it shall be noted that, if the diode chip D is replaced with a resistor R, a projection of the center point of the resistor R on the base plane of the power module is disposed within a circle, defined with the center point O of the switch chip $S_1$ as the center of the circle, and the value which is n times of the width W and length L of the switch chip $S_1$ as the radius, i.e., the radius of the circle is $R_{resistor}$=n×max{W, L}, wherein n may be 0.5, 1, 1.5, 2 and so on, and for example, n=2.

Otherwise, a projection of the center point $O_2$ of the diode chip D on the base plane of the power module is located in a circle, defined with a projection of the center point $O_3$ of the clamping capacitor C on the base plane of the power module as the center of the circle, and $R'_{diode}$=m×max{$W_3$, $L_3$} as the radius, wherein $W_3$ and $L_3$ are the width and the length of the clamping capacitor chip C respectively.

When the clamping capacitor C is assembled on circuit board and the diode chip D is assembled on the base plane of the power module, a projection of the center point $O_3$ of the clamping capacitor chip C on the base plane of the power module is located within a circle, defined with the center point of the switch chip $S_1$ as the center of the circle, and $R_{cap}$=m×max{W, L} as the radius, wherein W and L are the width and the length of the switch chip $S_1$ respectively.

The center point $O_2$ of the diode chip D is located within a circle, defined with the center point of the switch chip $S_1$ as the center of the circle, and $R_{diode}$=n×max{W, L} as the radius, wherein W and L are the width and the length of the switch chip $S_1$ respectively.

Similarly, it shall be noted that, if the diode chip D is replaced with the resistor R, the center point of the resistor R may be disposed within a circle, defined with the center point O of the switch chip $S_1$ as the center of the circle, and the value which is n times of a maximum one of the width W and the length L of the switch chip $S_1$ as the radius, i.e., the radius of the circle is $R_{resistor}=n\times\max\{W, L\}$, wherein n may be 0.5, 1, 1.5, 2 and so on, and for example, n=2.

Otherwise, the center point $O_2$ of the diode chip D is located within a circle, defined with a projection of the center point $O_3$ of the clamping capacitor chip C on the base plane of the power module as the center of the circle, and $R'_{diode}=n\times\max\{W_3, L_3\}$ as the radius, wherein $W_3$ and $L_3$ are the width and the length of the clamping capacitor chip C respectively.

When the clamping capacitor C is assembled on the base plane of the power module and the diode chip D is assembled on the circuit board, the center point $O_3$ of the clamping capacitor chip C is located within a circle, defined with the center point of the switch chip $S_1$ as the center of the circle, and $R_{cap}=m\times\max\{W, L\}$ as the radius, wherein W and L are the width and the length of the switch chip $S_1$ respectively.

A projection of the center point $O_2$ of the diode chip D on the base plane of the power module is located within a circle, defined with the center point of the switch chip $S_1$ as the center of the circle, and $R_{diode}=n\times\max\{W, L\}$ as the radius, wherein W and L are the width and the length of the switch chip $S_1$ respectively.

Similarly, it shall be noted that, if the diode chip D is replaced with the resistor R, a projection of the center point of the resistor R on the base plane of the power module may be disposed within a circle, defined with the center point O of the switch chip $S_1$ as the center of the circle, and the value which is n times of a maximum one of the width W and the length L of the switch chip $S_1$ as the radius, i.e., the radius of the circle is $R_{resistor}=n\times\max\{W, L\}$, wherein n may be 0.5, 1, 1.5, 2 and so on, and for example, n=2.

Otherwise, a projection of the center point $O_2$ of the diode chip D on the base plane of the power module is located within a circle, defined with the center point $O_3$ of the clamping capacitor chip C on the base plane of the power module as the center of the circle, and $R'_{diode}=n\times\max\{W_3, L_3\}$ as the radius, wherein $W_3$ and $L_3$ are the width and the length of the clamping capacitor chip C respectively.

In addition to the above methods for connecting the charging loop of the voltage clamping circuit to the switch chip, according to an embodiment of the present disclosure, a part or all of the components in the discharging loop may use pins, or be assembled on the base plane of the power module, and its detailed connection manners are the same as that of the components of the charging loop, so its detailed description are omitted.

Since the parasitic inductances of the components of the discharging loop do not produce severe influence of the instantaneous voltage as that of the parasitic inductance of the components of the charging loop, the components of the discharging loop such as a discharging resistor, a discharging diode, may be disposed at any position in the power module.

In the above embodiments, only examples where one voltage clamping circuit clamps one or more switch chips are described, but the present disclosure is not limited to this.

Figure 14:
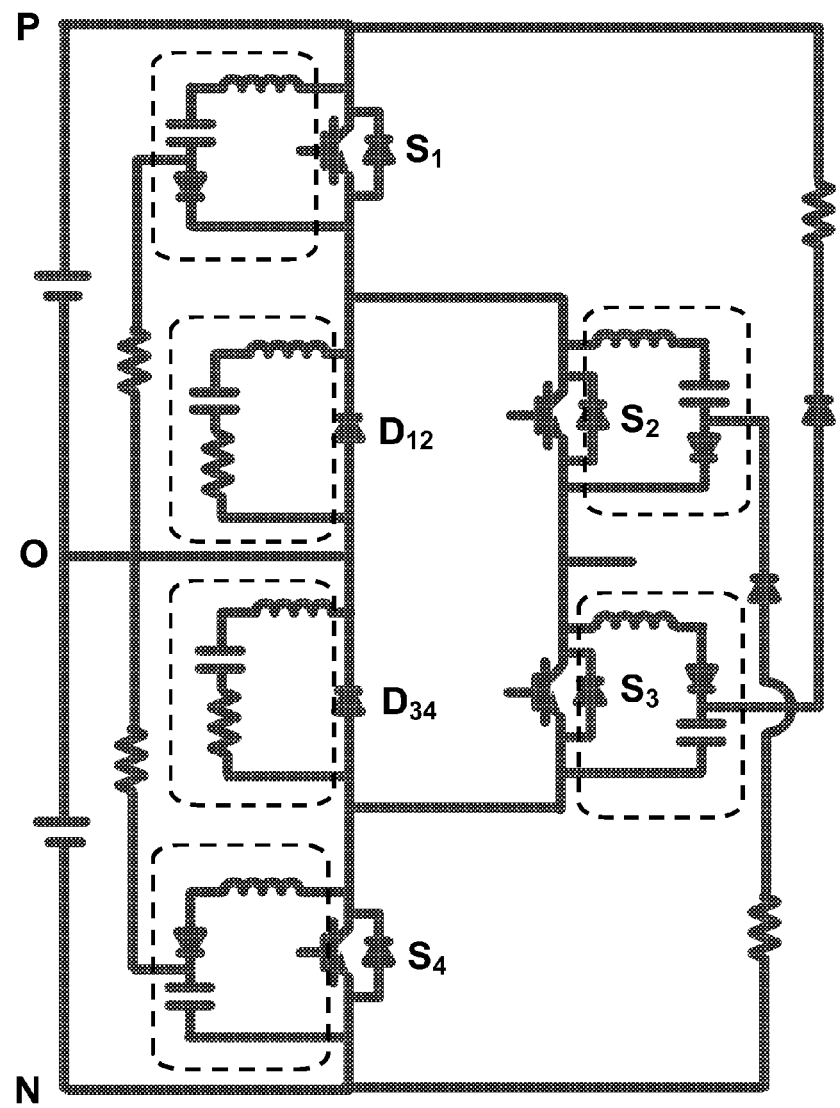
FIG. 14 illustrates an equivalent circuit where a plurality of voltage clamping circuits are employed to clamp a plurality of switch chips in a power module according to an embodiment of the present disclosure.

Still taking the three-level NPC converter as an example, FIG. 14 illustrates an equivalent circuit where a plurality of voltage clamping circuits are employed to clamp a plurality of switch chips in a power module according to an embodiment of the present disclosure.

As shown in FIG. 14, in the three-level NPC converter, for different switching components $S_1$, $S_2$, $S_3$, $S_4$ and $D_{12}$ and $D_{34}$, according to the embodiments of the present disclosure, the influence of the parasitic inductance may be reduced by reasonably disposing different positions of the voltage clamping circuit (for example, including the RCD voltage clamping circuit, RC voltage snubber circuit and so on), thereby the power density of the whole power module may be improved.

It shall be noted that, although the above embodiments are described by taking the case where the internal circuit of the power module is a three-level NPC converter as an example, the present disclosure is not limited to this, and the present disclosure may be applied into various power modules including converters or inverters and so on.

Embodiments of the present disclosure provide a power module. By reasonably disposing the positions of the voltage clamping circuit, especially disposing the position of the components in the charging loop of the voltage clamping circuit, the voltage spike on the switching components in the power module at the moment of switching on or off is extremely limited, thereby the switching speed is improved and a smaller switching loss is maintained. Consequently, the power density of the whole power module is improved.

The exemplary embodiments of the present disclosure are illustrated and described above in detail. It shall be appreciated that the present disclosure is not limited to the disclosed embodiments but intended to encompass various modification and equivalent substitution within the scope of the appended claims.

What is claimed is:

1. A power module, comprising:
   a base plane;
   at least one switch chip assembled on the base plane; and
   a voltage clamping circuit for clamping a voltage spike occurring on the at least one switch chip, comprising components of a charging loop, wherein the components of the charging loop at least comprise a capacitor,
   a projection of a center point of at least one of the components of the charging loop on the base plane is located within at least one first circle, defined with a center of the first circle being a center point of the at least one switch chip, and with a radius of the first circle being a product of a maximum one of a length and a width of the at least one switch chip and a first coefficient which is a multiple of 0.5.

2. The power module according to claim 1, wherein
   the components of the charging loop comprise two pins,
   the two pins are assembled on the base plane and connect the voltage clamping circuit to the at least one switch chip, and
   the projection of the center point of the at least one of the components of the charging loop on the base plane being located within the at least one first circle, comprises: positions of the two pins on the base plane are located within the first circle.

3. The power module according to claim 2, wherein
   the components of the charging loop comprise the capacitor, and the two pins connect the capacitor to the at least one switch chip, or
   the components of the charging loop comprise the capacitor and a switch device, and the two pins connect the capacitor and the switch device to the at least one switch chip, or
   the components of the charging loop comprise the capacitor and a resistor, and the two pins connect the capacitor and the resistor to the at least one switch chip.

4. The power module according to claim 1, wherein
the components of the charging loop comprise the capacitor,
the capacitor is assembled on the base plane, and
the projection of the center point of the at least one of the components of the charging loop on the base plane being located within the at least one first circle, comprises: a position of the capacitor on the base plane is located within the first circle.

5. The power module according to claim 1, wherein a number of the voltage clamping circuit is one or more than one, and when the number of the voltage clamping circuit is more than one, a number of the at least one switch chip is more than one, and the voltage clamping circuits respectively clamp different one or more of the switch chips.

6. A power module, comprising:
a base plane;
at least one switch chip assembled on the base plane; and
a voltage clamping circuit for clamping a voltage spike occurring on the at least one switch chip, comprising first components of a charging loop and a second component of the charging loop, wherein at least one of the first components of the charging loop and the second component of the charging loop is a capacitor,
wherein a projection of a center point of at least one of the first components of the charging loop on the base plane is located within at least one first circle, defined with a center of the first circle being a center point of the at least one switch chip, and with a radius of the first circle being a product of a maximum one of a length and a width of the at least one switch chip and a first coefficient which is a multiple of 0.5, or
wherein a projection of a center point of at least one of the first components of the charging loop on the base plane is located within a second circle, defined with a center of the second circle being a projection of a center point of the second component of the charging loop on the base plane, and with a radius of the second circle being a product of a maximum one of a length and a width of the second component of the charging loop and the first coefficient.

7. The power module according to claim 6, wherein
the first components of the charging loop comprise two pins and the capacitor,
the second component of the charging loop is a switch device,
the two pins and the switch device are assembled on the base plane, the two pins connect the capacitor and the switch device to the at least one switch chip,
the projection of the center point of the at least one of the first components of the charging loop on the base plane being located within the at least one first circle, comprises: positions of the two pins on the base plane are located within the first circle,
the projection of the center point of the at least one of the first components of the charging loop on the base plane being located within the second circle, comprises: the positions of the two pins on the base plane are located within the second circle, and
a position of a center point of the switch device on the base plane is located within at least one third circle, defined with a center of the third circle being the center point of the at least one switch chip, and with a radius of the third circle being a product of the maximum one of the length and the width of the at least one switch chip and a second coefficient.

8. The power module according to claim 7, wherein the first coefficient is greater than the second coefficient.

9. The power module according to claim 6, wherein
the first components of the charging loop comprise two pins and a third component of the charging loop,
the two pins and the second component of the charging loop are assembled on the base plane, and the two pins connect the third component of the charging loop and the second component of the charging loop to the at least one switch chip,
the projection of the center point of the at least one of the first components of the charging loop on the base plane being located within the at least one first circle, comprises: positions of the two pins on the base plane are located within the first circle,
the projection of the center point of the at least one of the first components of the charging loop on the base plane being located within the second circle, comprises: the positions of the two pins on the base plane are located within the second circle, and
the center point of the second component of the charging loop on the base plane is located within at least one third circle, defined with a center of the third circle being the center point of the at least one switch chip, and with a radius of the third circle being the product of the maximum one of the length and the width of the at least one switch chip and the first coefficient.

10. The power module according to claim 9, wherein
the third component of the charging loop and the second component of the charging loop are the capacitor and a resistor respectively, or
the third component of the charging loop and the second component of the charging loop are a resistor and the capacitor respectively, or
the third component of the charging loop and the second component of the charging loop are a switch device and the capacitor respectively.

11. The power module according to claim 6, further comprising a circuit board in parallel with and connected to the base plane, wherein
the first components of the charging loop comprise two pins and the capacitor,
the second component of the charging loop is a switch device,
the switch device is assembled on the circuit board,
the two pins are assembled on the base plane, and the two pins connect the capacitor and the switch device to the at least one switch chip,
the projection of the center point of the at least one of the first components of the charging loop on the base plane being located within the at least one first circle, comprises: positions of the two pins on the base plane are located within the first circle,
the projection of the center point of the at least one of the first components of the charging loop on the base plane being located within the second circle, comprises: the positions of the two pins on the base plane are located within the second circle, and
a projection of a center point of the switch device on the base plane is located within at least one third circle, defined with a center of the third circle being the center point of the at least one switch chip, and with a radius of the third circle being a product of the maximum one of the length and the width of the at least one switch chip and a second coefficient.

12. The power module according to claim 11, wherein the first coefficient is greater than the second coefficient.

13. The power module according to claim 6, further comprising a circuit board in parallel with and connected to the base plane, wherein
the first components of the charging loop comprise two pins and a third component of the charging loop,
the second component of the charging loop is assembled on the circuit board,
the two pins are assembled on the base plane, and the two pins connect the third component of the charging loop and the second component of the charging loop to the at least one switch chip,
the projection of the center point of the at least one of the first components of the charging loop on the base plane being located within the at least one first circle, comprises: positions of the two pins on the base plane are located within the first circle,
the projection of the center point of the at least one of the first components of the charging loop on the base plane being located within the second circle, comprises: the positions of the two pins on the base plane are located within the second circle, and
the projection of the center point of the center point of the second component of the charging loop on the base plane is located within at least one third circle, defined with a center of the third circle being the center point of the at least one switch chip, and with a radius of the third circle being the product of the maximum one of the length and the width of the at least one switch chip and the first coefficient.

14. The power module according to claim 13, wherein
the third component of the charging loop and the second component of the charging loop are the capacitor and a resistor respectively, or
the third component of the charging loop and the second component of the charging loop are a resistor and the capacitor respectively, or
the third component of the charging loop and the second component of the charging loop are a switch device and the capacitor respectively.

15. The power module according to claim 6, wherein
the first components of the charging loop and the second component of the charging loop are both assembled on the base plane, and
the center point of the component of the charging loop on the base plane is located within at least one third circle, defined with a center of the third circle being the center point of the at least one switch chip, and with a radius of the third circle being a product of the maximum one of the length and the width of the at least one switch chip and a second coefficient.

16. The power module according to claim 15, wherein the first component of the first charging loop and the second component of the charging loop are the capacitor and a switch device respectively.

17. The power module according to claim 15, wherein the first coefficient is greater than the second coefficient.

18. The power module according to claim 6, wherein
the first components of the charging loop and the second component of the charging loop are both assembled on the base plane, and
a position of the center point of the second component of the charging loop is located within the at least one first circle,
wherein a position of the center point of the at least one of the first components of the charging loop on the base plane is located within at least one third circle, defined with a center of the third circle being the center point of the at least one switch chip, and with a radius of the third circle being a product of the maximum one of the length and the width of the at least one switch chip and a second coefficient, wherein the second coefficient is less than or equal to the first coefficient, or
wherein a position of the center point of the at least one of the first components of the charging loop on the base plane is located within the second circle, defined with the center of the second circle being the center point of the second component of the charging loop, and with the radius of the second circle being the product of the maximum one of the length and the width of the second component of the charging loop and the first coefficient.

19. The power module according to claim 18, wherein the first component of the charging loop and the second component of the charging loop are a switch device and the capacitor respectively.

20. The power module according to claim 6, wherein
the first components of the charging loop and the second component of the charging loop are both assembled on the base plane, and
the center point of the second component of the charging loop on the base plane is located within at least one third circle, defined with a center of the third circle being the center point of the at least one switch chip, and with a radius of the third circle being the product of the maximum one of the length and the width of the at least one switch chip and the first coefficient.

21. The power module according to claim 20, wherein
the first component of the charging loop and the second component of the charging loop are the capacitor and a resistor respectively, or
the first component of the charging loop and the second component of the charging loop are a resistor and the capacitor respectively.

22. The power module according to claim 20, further comprising a circuit board in parallel with and connected to the base plane, wherein
the first components of the charging loop are assembled on the base plane, the second component of the charging loop is assembled on the circuit board, and the projection of the center point of the second component of the charging loop on the base plane is located within at least one third circle, defined with a center of the third circle being the center point of the at least one switch chip, and with a radius of the third circle being a product of the maximum one of the length and the width of the at least one switch chip and a second coefficient, or
the first components of the charging loop are assembled on the circuit board, the second component of the charging loop is assembled on the base plane, and a position of the center point of the second component of the charging loop on the base plane is located within at least one third circle, defined with a center of the third circle being the center point of the at least one switch chip, and with radius of the third circle being a product of the maximum one of the length and the width of the at least one switch chip and a second coefficient.

23. The power module according to claim 22, wherein the first component of the charging loop and the second component of the charging loop are the capacitor and a switch device respectively.

24. The power module according to claim 22, wherein the first coefficient is greater than the second coefficient.

25. The power module according to claim 6, further comprising a circuit board in parallel with and connected to the base plane, wherein the first components of the charging loop are assembled on the base plane, and the second component of the charging loop is assembled on the circuit board, and the projection of the center point of the second component of the charging loop on the base plane is located within the at least one first circle, a position of the center point of the at least one of the first components of the charging loop on the base plane is located within at least one third circle, defined with a center of the third circle being the center point of the at least one switch chip, and with a radius of the third circle being a product of the maximum one of the length and the width of the at least one switch chip and a second coefficient, and the second coefficient is smaller than or equal to the first coefficient, or, a position of the at least one of the first components of the charging loop on the base plane is within the second circle, defined with the center of the second circle being the projection of the center point of the second component of the charging loop on the base plane, and with the radius of the second circle being the product of the maximum one of the length and the width of the second component of the charging loop and the first coefficient.

26. The power module according to claim 6, further comprising a circuit board in parallel with and connected to the base plane, wherein the first components of the charging loop are assembled on the circuit board, and the second component of the charging loop is assembled on the base plane, and a position of the center point of the second component of the charging loop is located within the at least one first circle, the projection of the center point of the at least one of the first components of the charging loop on the base plane is located within at least one third circle, defined with a center of the third circle being the center point of the at least one switch chip, and with a radius of the third circle being a product of the maximum one of the length and the width of the at least one switch chip and a second coefficient, and the second coefficient is smaller than or equal to the first coefficient, or, the projection of the center point of the at least one of the first components of the charging loop on the base plane is located within the second circle, defined with the center of the second circle being the center point of the second component of the charging loop, and with the radius of the second circle being the product of the maximum one of the length and the width of the second component of the charging loop and the first coefficient.

27. The power module according to claim 25, wherein the first component of the charging loop and the second component of the charging loop are a switch device and the capacitor respectively.

28. The power module according to claim 26, wherein the first component of the charging loop and the second component of the charging loop are a switch device and the capacitor respectively.

29. The power module according to claim 6, further comprising a circuit board in parallel with and connected to the base plane, wherein the first components of the charging loop are assembled on the base plane, the second component of the charging loop is assembled on the circuit board, and the projection of the center point of the second component of the charging loop on the base plane is located within at least one third circle, defined with a center of the third circle being the center point of the at least one switch chip, and with a radius of the third circle being the product of the maximum one of the length and the width of the at least one switch chip and the first coefficient, or the first components of the charging loop is assembled on the circuit board, the second component of the charging loop is assembled on the base plane, and a position of the center point of the second component of the charging loop on the base plane is located within at least one third circle, defined with a center of the third circle being the center point of the at least one switch chip, and with a radius of the third circle being the product of the maximum one of the length and the width of the at least one switch chip and the first coefficient.

30. The power module according to claim 29, wherein the first component of the charging loop and the second component of the charging loop are the capacitor and a resistor respectively, or the first component of the charging loop and the second component of the charging loop are a resistor and the capacitor respectively.

31. The power module according to claim 6, further comprising a circuit board in parallel with and connected to the base plane, wherein the first components of the charging loop and the second component of the charging loop are both assembled on the circuit board, and projection of the center point of the second component of the charging loop on the base plane is located within at least one third circle, defined with a center of the third circle being the center point of the at least one switch chip, and with a radius of the third circle being a product of the maximum one of the length and the width of the at least one switch chip and a second coefficient.

32. The power module according to claim 31, wherein the first component of the charging loop and the second component of the charging loop are the capacitor and a switch device respectively.

33. The power module according to claim 31, wherein first coefficient is greater than the second coefficient.

34. The power module according to claim 6, further comprising a circuit board in parallel with and connected to the base plane, wherein the first components of the charging loop and the second component of the charging loop are both assembled on the circuit board, and the projection of the center point of the second component of the charging loop on the base plane is located within the at least one first circle, wherein the projection of the center point of the at least one of the first components of the charging loop on the base plane is located within at least one third circle, defined with a center of the third circle being the center point of the at least one switch chip, and with a radius of the third circle being a product of the maximum one of the length and the width of the at least one switch chip and a second coefficient, and the second coefficient is smaller than or equal to the first coefficient, or wherein the projection of the center point of the at least one of the first components of the charging loop on the base plane is located within the second circle, defined with the center of the second circle being the projection of the center point of the second component of the charging loop on the base plane, and with the radius of the second circle being the product of the maximum one of the length and the width of the second component of the charging loop and the first coefficient.

35. The power module according to claim 34, wherein the first component of the charging loop and the second component of the charging loop are a switch device and the capacitor respectively.

36. The power module according to claim 6, further comprising a circuit board in parallel with and connected to the base plane, wherein the first components of the charging loop and the second component of the charging loop are both assembled on the circuit board;

projection of the center point of the second component of the charging loop on the base plane is located within at least one third circle, defined with a center of the third circle being the center point of the at least one switch chip, and with a radius of the third circle being the product of the maximum one of the length and the width of the at least one switch chip and the first coefficient.

37. The power module according to claim 36, wherein the first component of the charging loop and the second component of the charging loop are the capacitor and a resistor respectively, or the first component of the charging loop and the second component of the charging loop are a resistor and the capacitor respectively.

38. The power module according to claim 6, wherein a number of the voltage clamping circuit is one or more than one, and when the number of the voltage clamping circuit is more than one, a number of the at least one switch chip is more than one, and the voltage clamping circuits respectively clamp different one or more of the switch chips.

* * * * *